United States Patent [19]

Sakamoto et al.

[11] Patent Number: 4,757,282

[45] Date of Patent: Jul. 12, 1988

[54] LINE FILTER

[75] Inventors: Yukio Sakamoto; Kouichi Yamaguchi, both of Fukui, Japan

[73] Assignee: Murata Manufacturing Co., Ltd., Japan

[21] Appl. No.: 914,232

[22] Filed: Oct. 2, 1986

[30] Foreign Application Priority Data

Oct. 7, 1985 [JP] Japan .................... 60-223967

[51] Int. Cl.$^4$ ............................ H03H 7/00
[52] U.S. Cl. ........................ 333/181; 333/185
[58] Field of Search ........... 333/12, 181, 185, 167; 361/401; 336/200; 339/143 R

[56] References Cited

U.S. PATENT DOCUMENTS

| | | | |
|---|---|---|---|
| 3,872,399 | 3/1975 | Friberg et al. | 333/185 |
| 4,320,364 | 3/1982 | Sakamoto et al. | 333/185 X |
| 4,408,171 | 10/1983 | Akino et al. | 333/181 X |
| 4,455,538 | 6/1984 | Kinzler | 333/185 X |
| 4,472,693 | 9/1984 | Uemura et al. | 333/185 X |
| 4,543,554 | 9/1985 | Muellenheim et al. | 333/181 X |
| 4,553,114 | 11/1985 | English et al. | 333/185 X |
| 4,563,659 | 1/1986 | Sakamoto | 333/181 |
| 4,620,165 | 10/1986 | Kinzler | 333/185 X |

FOREIGN PATENT DOCUMENTS 2446714  4/1976  Fed. Rep. of Germany ...... 333/181

Primary Examiner—Eugene R. LaRoche
Assistant Examiner—Seung Ham
Attorney, Agent, or Firm—Ostrolenk, Faber, Gerb & Soffen

[57] ABSTRACT

A first bypass-type condenser for normal mode noise is connected between the input terminals of a pair of signal paths and a pair of further bypass-type condensers for common mode noise are each connected between a respective one of the signal paths and ground. The pair of further bypass-type condensers each comprise a three-terminal condenser having a pair of lead terminals each provided with a bead core thereon, whereby noise passing through the line filter can be effectively eliminated, while also eliminating spurious LC resonance effects at ultra-high frequencies.

6 Claims, 11 Drawing Sheets

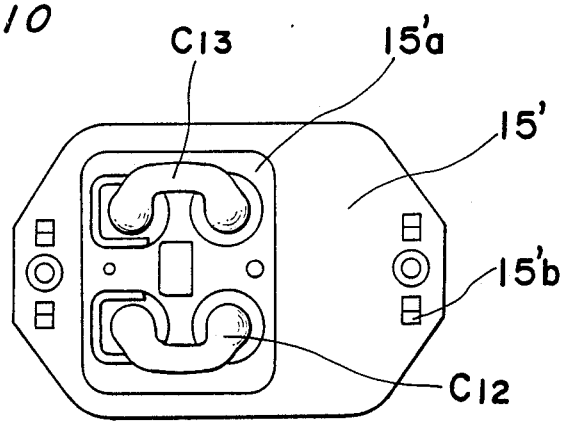
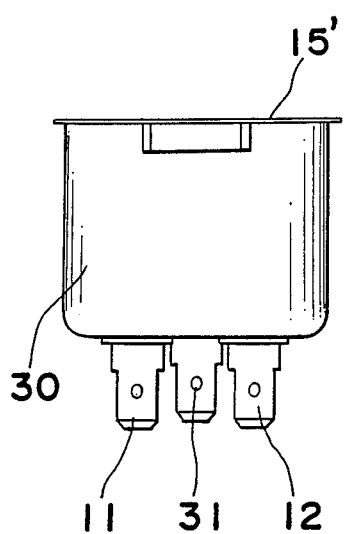
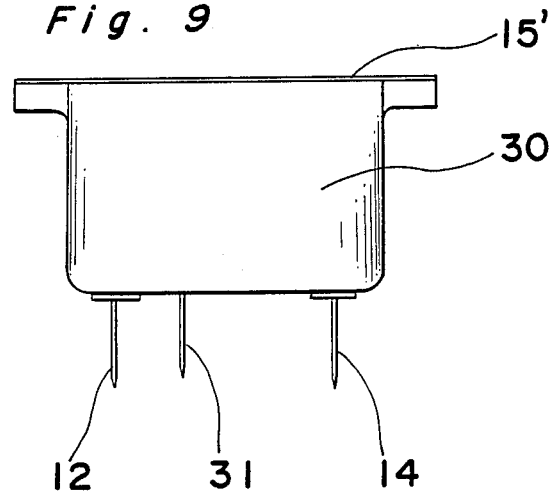
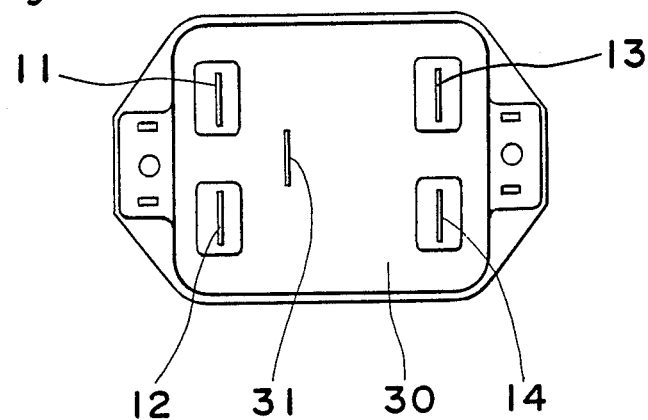

LINE FILTER

BACKGROUND OF THE INVENTION

The present invention relates to a line filter to be inserted for use in a power source line of various kinds of electric devices.

A practical line filter of this type has been proposed as shown in FIG. 20 which comprises a metal case 5 of rectangular solid shape having a pair of input terminals 1, 2 and a pair of output terminals 3, 4, and a filter unit 6 having an electric equivalent circuit as shown in FIG. 21, the filter unit 6 being accommodated within the metal case 5. In this conventional line filter, the filter unit 6 is composed of one bypass-type condenser (capacitor) C1 for use to suppress the noise of normal mode, connected between a pair of lines 8a and 8b provided on a printed circuit board 7, and a pair of bypass-type condensers C2, C3 for use to suppress the noise of common mode, one condenser C2 connected between the line 8a and an earth line 9 formed on the printed circuit board 7 and the other condenser C3 connected between the line 8b and the earth line 9, the earth line 9 being soldered to the metal case 5 by means of solder.

The upper limit frequency of noise to be eliminated by the above line filters is normally restricted to about a maximum of 30 MHz, by existing residual inductance on lead lines 10'a, 10'b of the bypass-type condenser C3 for common mode noise, and on lead lines 10a, 10b of the bypass-type condenser C2 for common mode noise. This is because the residual inductance of lead lines 10a, 10'a acts to reject noise to be inputted into both bypass-type condensers C2 and C3 for common mode noise, while the residual inductance of lead lines 10b, 10'b acts to suppress noise being bypassed to the earth from the bypass-type condensers C2 and C3 for common mode noise.

Generally, noise which may be inputted into electric devices of various kinds through a power source line, or which may be outputted from the electric devices, is classified into two kinds: conduction noise and radiation noise. The conduction noise largely contains frequency components lower than 10 MHz which can be easily removed by the employment of the conventional line filter, but the radiation noise, as well higher harmonic waves of clock signals used in electric devices, often contains high frequency components of from 30 MHz up to several hundred MHz which are difficult to remove by means of the conventional line filter in any way. Therefore, a through-type condenser (feedthrough capacitor) is employed in place of each of the bypass-type condensers C2 and C3 for common mode noise, which is mounted on the metal case 5 to provide an equivalent circuit as shown in FIG. 22. The line filter with the through-type condensers can remove the high frequency components from the noise better than the conventional filter having bypass-type condensers, by decreasing the residual inductance which is formed on the lead lines in the conventional filter. However, the through-type condensers are expensive and increase the cost of the line filter to a large extent. In addition, if the line filter having through-type condensers C2' and C3' for common mode noise is used within a frequency range where the bypass-condenser C1 for normal mode noise functions as an inductor combined with a capacitor, all of the above condensers C1, C2' and C3' are caused to form an LC resonance circuit which reduces the function of the through-type condensers for removing the noise in the line filter.

SUMMARY OF THE INVENTION

Accordingly, an essential object of the present invention is to provide a line filter which can eliminate disadvantages inherent in the conventional filter, which is simple in construction and low in cost, and which can effectively remove high frequency noise, such as radiation noise, including high frequency components of about several hundred MHz.

The line filter of the present invention is arranged such that a bypass-type condenser of two teminals for normal mode noise is provided between a first line path formed by an input terminal and an output terminal and a second line path formed by input terminal and an output terminal, and a pair of bypass-type condensers of three terminals for common mode noise with a pair of bead cores mounted on the lead terminals are provided between the above line paths and earth terminals, respectively. With the line filter of the present invention, noise to be passed through from the input terminals to the output terminals is prevented by the inductance components of the three-terminal condensers, and is caused to bypass to the earth terminals by means of the capacitance components of the three-terminal condensers. The line filter of the present invention is employed with the pair of three-terminal condensers having bead cores on their lead terminals (said three-terminal condensers being used as bypass-type condensers for common mode noise to be connected among the input, output and earth terminals of the line filter), whereby the common mode noise to be passed in the line filter is bypassed to the earth after reaching the electrodes of the respective condenser units of the pair of three-terminal condensers. Even if the line filter is used within a frequency range where the bypass condenser for normal mode noise is both adapted to function as an inductor and a capacitor, to form an LC resonance circuit with the pair of three-terminal condensers, the filter does not reduce the function for removing noise, since the LC resonance circuit has a low Q. Radiation noise including high frequency components of several hundred MHz can be removed which was difficult with the conventional filter. Also, the line filter of the present invention is provided with the three-terminal condensers having lead terminals provided with bead cores, whereby the residual inductances of the lead terminals are rendered to function as inductors in order to prevent the lead terminals from passing through the noise of the line filter, resulting in that the noise of line filter can be effectively removed by the three-terminal condensers, and the line filter is arranged with components of small number in simple construction at low cost.

BRIEF DESCRIPTION OF THE DRAWINGS

These and other objects and features of the present invention will become apparent from the following description of preferred embodiments thereof with reference to the accompanying drawings, in which:

FIG. 9 is a front view of a line filter in accordance with a second embodiment of the present invention;

FIG. 10 is a top plan view of the line filter of FIG. 9;

FIG. 11 is a side elevational view of the line filter of FIG. 9;

FIG. 12 is a bottom view of the line filter of FIG. 9;

DESCRIPTION OF THE PREFERRED EMBODIMENTS

Figure 1:
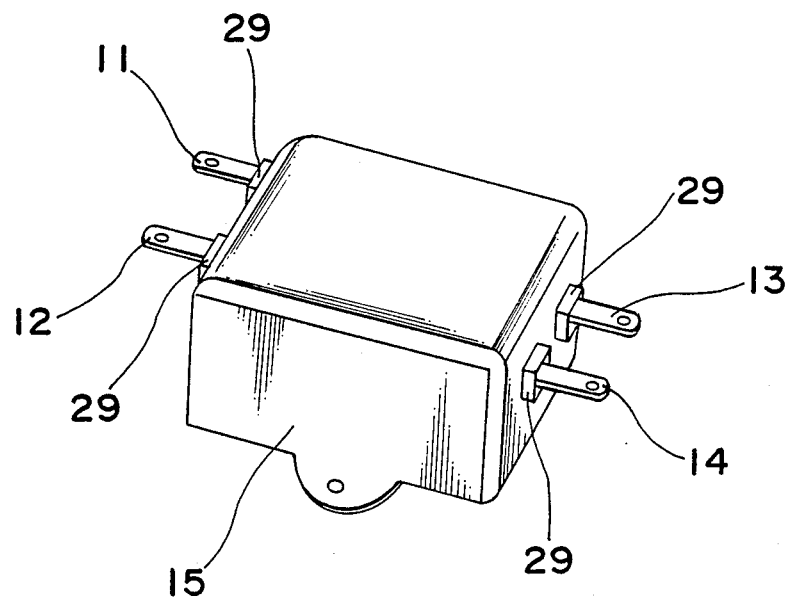
FIG. 1 is a perspective view of a line filter in accordance with a first embodiment of the present invention.

Before the description of the present invention proceeds, it is to be noted that like parts are designated by like reference numerals throughout the accompanying drawings.

FIGS. 1 to 7 show a line filter, according to one preferred embodiment of the present invention, comprising a metal case 15 with a pair of input terminals 11, 12 and a pair of output terminals 13, 14 extending through respective insulation bushings 29. A filter unit 16 includes a sheet of printed circuit board 17, a pair of input electrodes 21, 22, a pair of output electrodes 23, 24, and a pair of earth electrodes 27, 28 provided on the upper surface of the sheet 17, a two-terminal condenser C11 for normal mode noise, and a pair of three-terminal condensers C12, C13 for common mode noise, the filter unit 16 being accommodated within the metal case 15.

Figure 2:
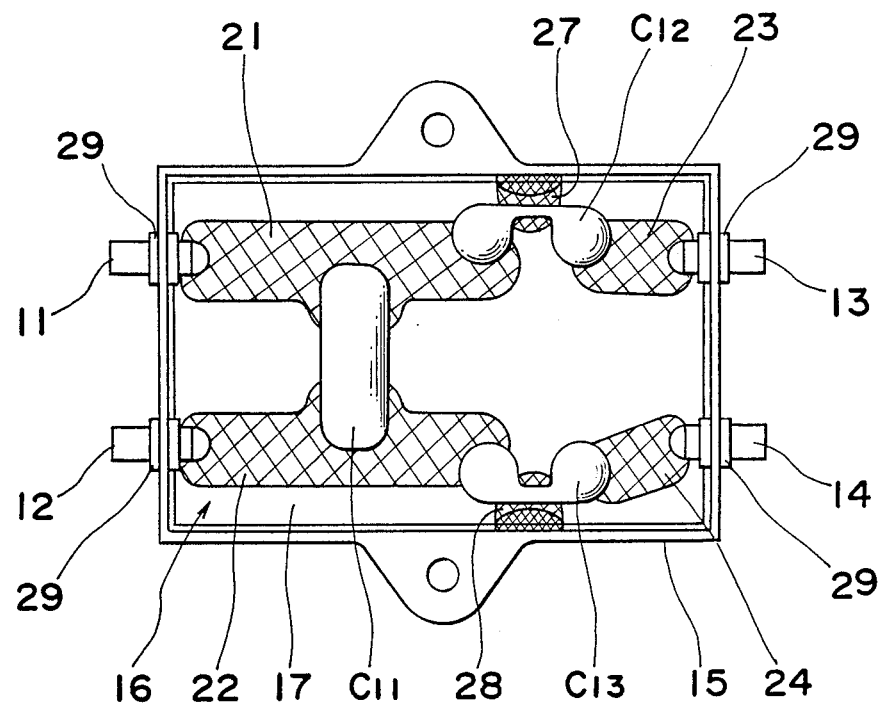
FIG. 2 is a top plan view showing the internal construction of the line filter of FIG. 1.

Each of the terminals 11 to 14 is insulated from the metal case 15 by the insulation bushings 29, and is connected to a corresponding one of the electrodes 21 to 24, as shown in FIG. 2, respectively. All of the electrodes 21 to 24 and 27, 28 are provided on the upper surface of the printed circuit board 17 in a conventional process, as shown in FIG. 2. The two-terminal condenser C11 is employed as a bypass-type condenser for use in the line filter as a suppressor for the normal mode noise that is generated, having two terminals each connected to a corresponding one of input electrodes 21, 22. Also, each of the three-terminal condensers C12, C13 is employed as a bypass-type condenser for use in the line filter as a suppressor for the common mode noise that is generated, having three terminals which are respectively connected to a corresponding one of the input electrodes 21, 22, one of the output electrodes 23, 24, and one of the earth electrodes 27, 28.

Figure 4:
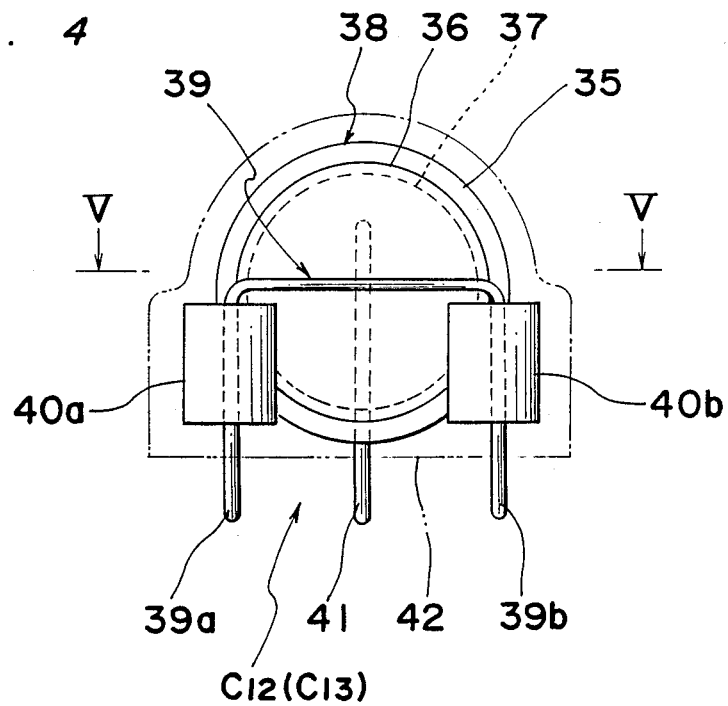
FIG. 4 is an explanatory, front view of a three-terminal condenser employed in the line filter of FIG. 1.
Figure 5:
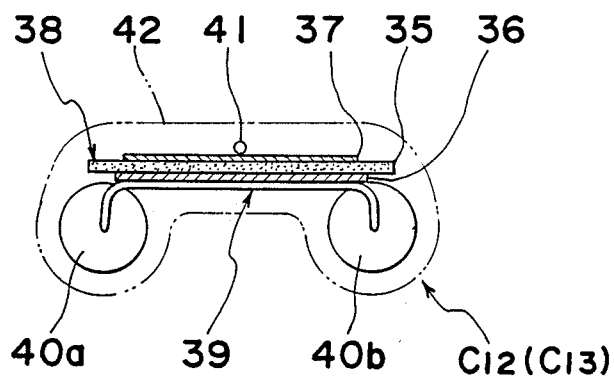
FIG. 5 is a cross-sectional view, taken along a line V—V of FIG. 4, of the three-terminal condenser.
Figure 6:
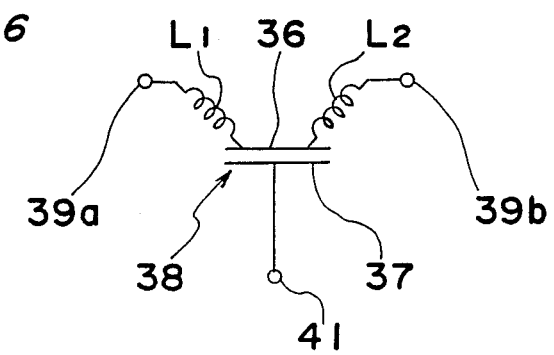
FIG. 6 is an equivalent circuit diagram for the three-terminal condenser of FIG. 4.

Each of the three-terminal condensers C12, C13 is constructed as shown in the drawings of FIGS. 4 and 5 to provide an equivalent circuit as shown in the drawings of FIG. 6. The three-terminal condenser C12 (C13) comprises a condenser unit 38 including a plate which comprises a dielectric disc 35, a pair of electrodes 36, 37 provided on the front and back surface of the dielectric disc 35, a wire lead terminal 39 which is bent in a U-shape, of which the middle portion is soldered onto the electrode and both ends 39a, 39b are extending to the outside to provide a pair of terminal legs, i.e., a first terminal leg and a second terminal leg, respectively. Another wire lead terminal 41 has a bar shape of which an upper portion is soldered onto the other electrode 37 and a lower portion is extending to the outside to provide a terminal leg, i.e., a third terminal leg. A pair of bead cores 40a, 40b, are made from ferrite materials and have openings through which the first and second terminal legs 39a, 39b of the one lead terminal 39 are inserted. A covering means 42 of resin encloses all the components 35, 36, 37, 40, 41 of the three-terminal condenser therein, except for the ends of the three terminal legs which are extending from the resin to the outside. With the above arrangement, the condenser unit 38 is provided with the pair of electrodes 36, 37 on either side of the dielectric disc 35, with the third terminal leg 41 connected onto the one electrode 37, and the first and second terminal legs 39 connected onto the other electrode 36, with inductances L1, L2 being formed by the bead cores 40, thereby to provide the equivalent circuit as shown in FIG. 6. In other words, the pair of bead cores 40a, 40b mounted on the first and second terminal legs 39a, 39b of the lead terminal 39 connected to the one 36 of the electrodes provide a pair of inductances L1, L2 between the electrode 36 and the pair of terminal legs 39a, 39b, while the other electrode 37 is connected directly to the third terminal leg 41 of the other lead terminal.

Figure 3:
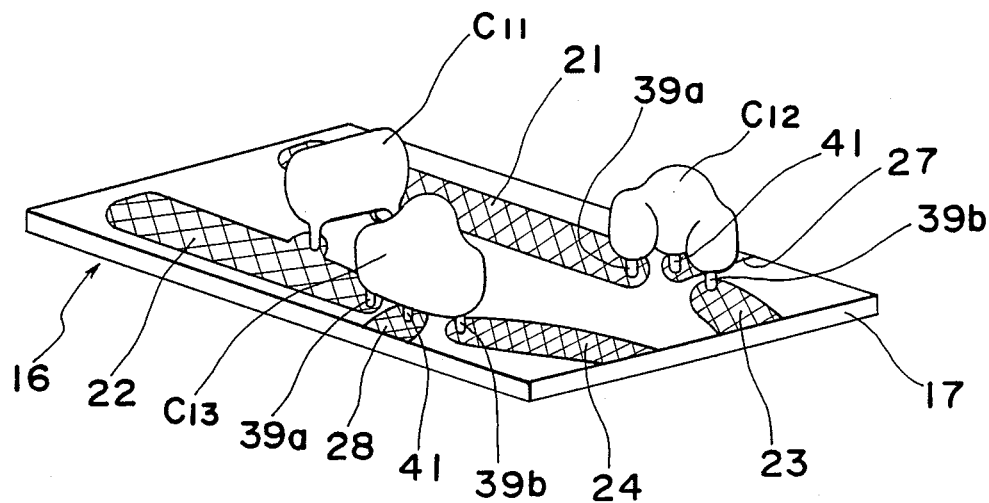
FIG. 3 is a perspective view of a filter unit employed in the line filter of FIG. 1.
Figure 7:
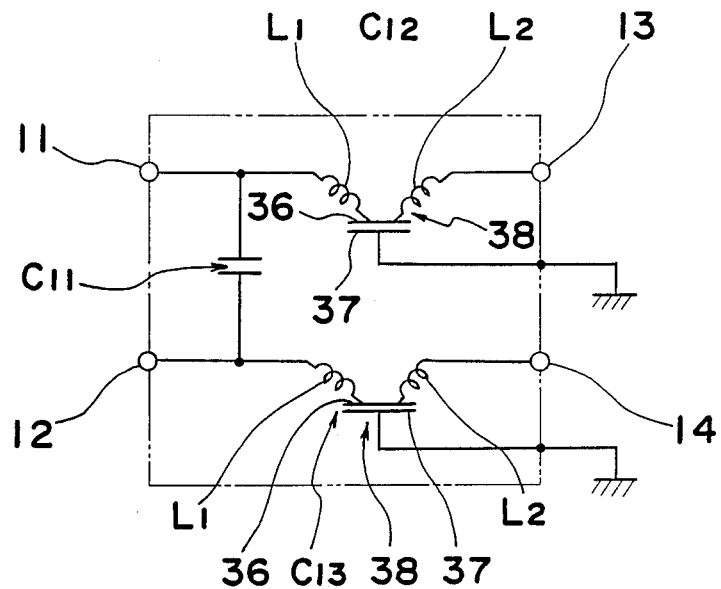
FIG. 7 is an equivalent circuit diagram for the line filter of FIG. 2.

As shown in FIGS. 3 and 7, each of the three-terminal condensers C12, C13 is mounted on the printed circuit board 17 in such a manner that the first terminal leg 39a is connected to the input electrode 21 (22), the third terminal leg 41 to the earth electrode 27 (28), and the second terminal leg 39b to the output electrode 23 (24) of the printed circuit board 17 by means of solder. Accordingly, the three-terminal condenser C12 (C13) is connected among the input, output and earth electrodes 21, 23, 27 (22, 24, 28) along each of the lines between the input and output terminals 11, 13 (12, 14), while the two-terminal condenser C11 is provided between the two input electrodes 21, 22 toward the input side from the three-terminal condensers C12, C13. The two-terminal condenser C11 is constructed, as in the conventional filter with good characteristics of high frequency filtering.

In the assembling steps of the line filter, firstly, the filter unit 16 is provided by mounting the pair of three-terminal condensers C12, C13 and the two-terminal condenser C11 onto the printed circuit board 17, and then, the board 17 is accommodated within the metal case 15.

Next, the pair of input electrodes 21, 22 of the printed circuit board 17 are respectively soldered onto the input terminals 11, 12 of the metal case 15, the output electrodes 23, 24 to the output terminals 13, 14, and the earth electrodes 27, 28 to the metal case 15 by means of solder.

Figure 21:
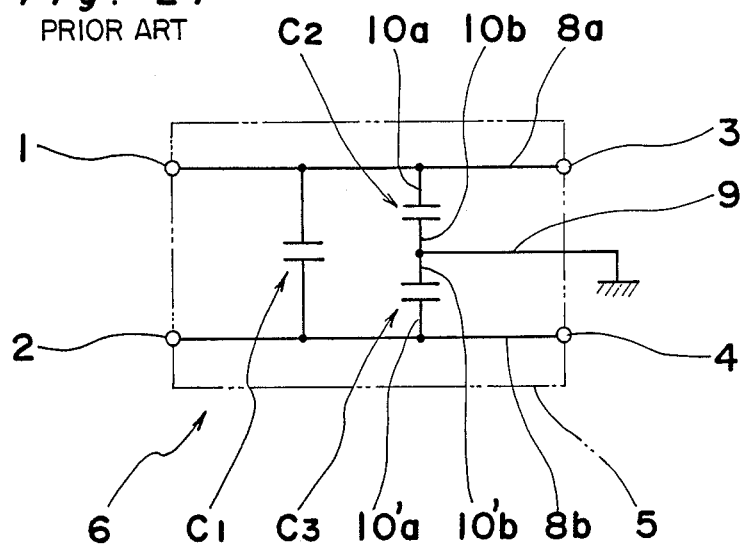
FIG. 21 is an electric circuit diagram showing an equivalent circuit diagram for the line filter of FIG. 20.
Figure 22:
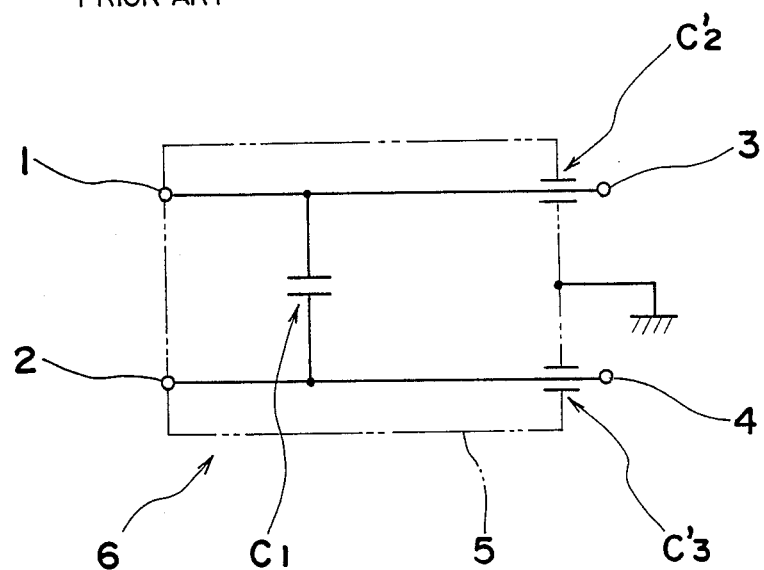
FIG. 22 is a view that is similar to FIG. 21, but showing an equivalent circuit diagram for one modification of the conventional line filter.

The line filter of the above arrangement is assembled with an equivalent circuit as shown in FIG. 7 in which the pair of the three-terminal condensers C12, C13 are employed in place of the pair of two-terminal condensers for filtering common mode noise which are provided in the conventional line filter of FIG. 21. As clearly understood from the equivalent circuit of FIG. 7, in the line filter of FIG. 2 the common mode noise is attenuated between the input terminal 11 and the output terminal 13, by the inductance L1 of bead core 40a of the three-terminal condenser C12. Then such noise arrives at the electrode 36 of the condenser unit 38, by which the common mode noise is caused to bypass to the earth and, furthermore, is attenuated by the inductance L2 of bead core 40b of the three-terminal condenser C12. Similarly, the common mode noise is attenuated between the input terminal 12 and the output terminal 14 by the inductance L1 of bead core 40a of the three-terminal condenser C13. Then such noise arrives at the electrode 36 of the condenser unit 38, by which the common mode noise is caused to bypass to the earth and, furthermore, is attenuated by the inductance L2 of bead core 40b of the three-terminal condenser C13.

Figure 20:
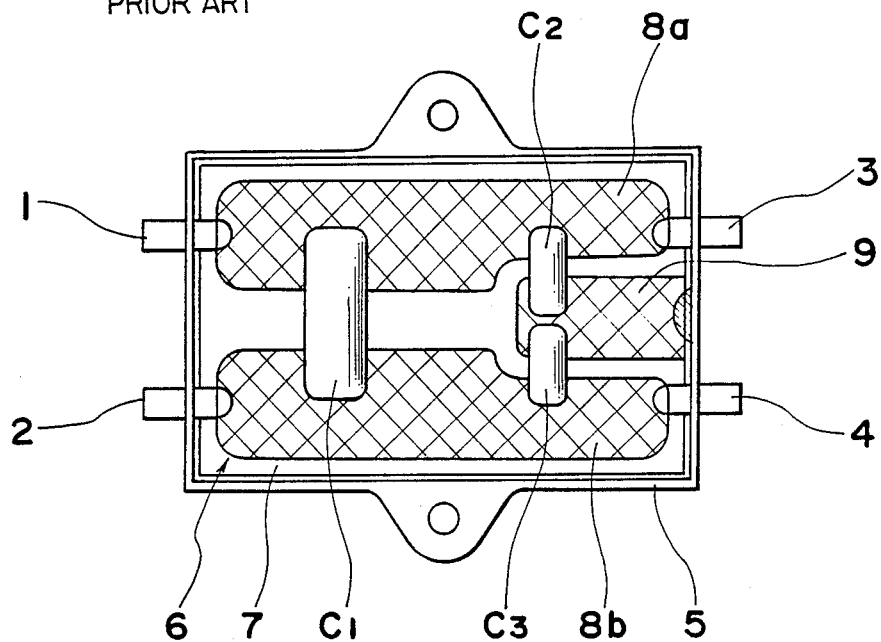
FIG. 20 is a top plan view showing the internal construction of a conventional line filter (already referred to)

Thus, the pair of the three-terminal condensers C12, C13 are employed as elements for causing attenuation against the common mode noise by the provision of the bead cores 40a, 40b on the terminal legs 39a, 39b of the lead terminal 39, in contrast to the two-terminal condensers for use with the common mode noise of FIG. 20. In addition, within the range of frequency wherein the bypass-type condenser for the normal mode noise functions as an inductance, the bead core 40a mounted on the terminal leg 39a of lead terminal 39 of the three-terminal condenser is operated to present an inductor to reduce the Q of an LC resonance circuit formed by the three-terminal condenser and the bypass-type condenser for the normal mode noise, thereby not to produce the lowering of function for the noise elimination which occurs by the employment of the through-type condenser in the conventional filter.

Accordingly, the line filter of this embodiment can improve the upper limit of frequency for eliminating the noise from an electric circuit up to about 300 MHz, thereby to ensure to eliminate the radiation noise effectively. In addition, since the line filter of this embodiment is assembled by a step of mounting three condensers C11, C12, C13 on one sheet of printed circuit board 17, an automatic assembling line can be applied to manufacture the line filter, resulting in that the manufacturing cost of the line filter can be greatly reduced.

Figure 8:
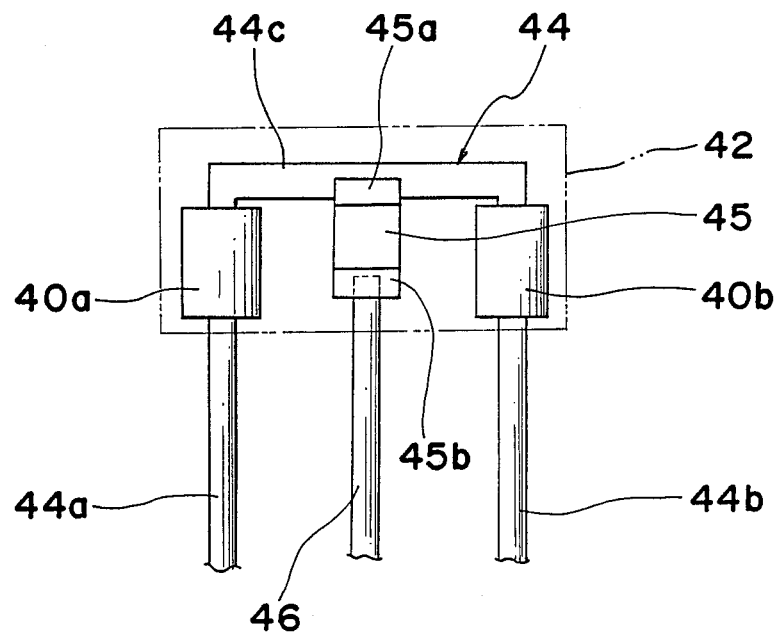
FIG. 8 is a view that is similar to FIG. 4, but showing one modification of the three-terminal condenser.
Figure 13:
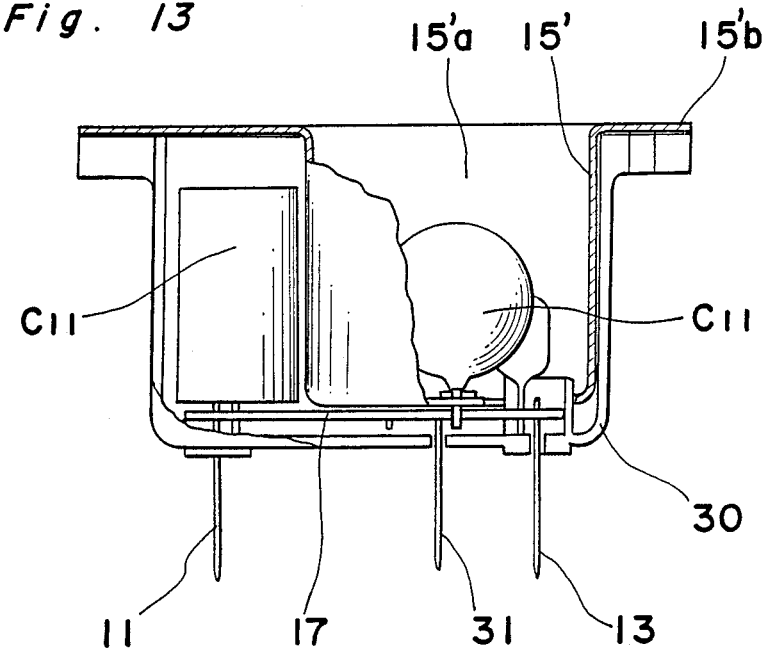
FIG. 13 is a partially broken away cross-sectional view, on an enlarged scale, of FIG. 9.
Figure 14:
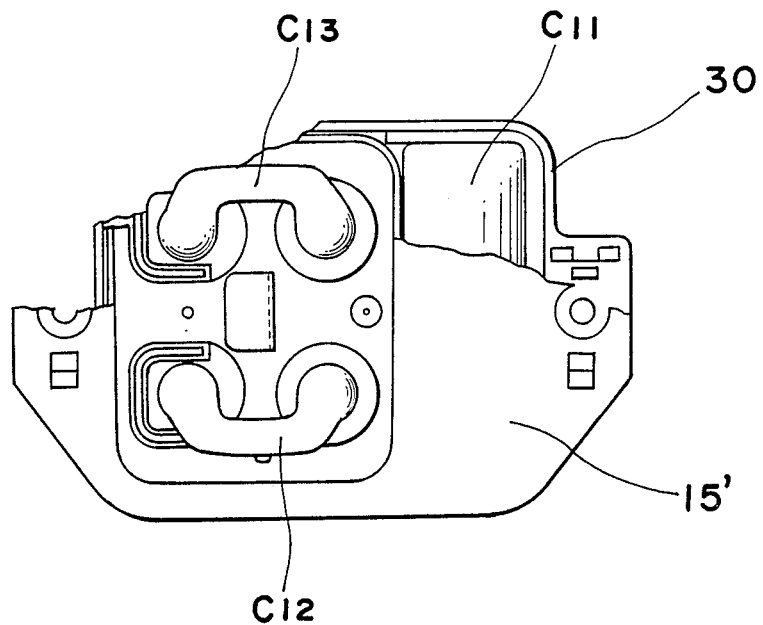
FIG. 14 is a partially broken away cross-sectional view, on an enlarged scale, of FIG. 10.
Figure 15:
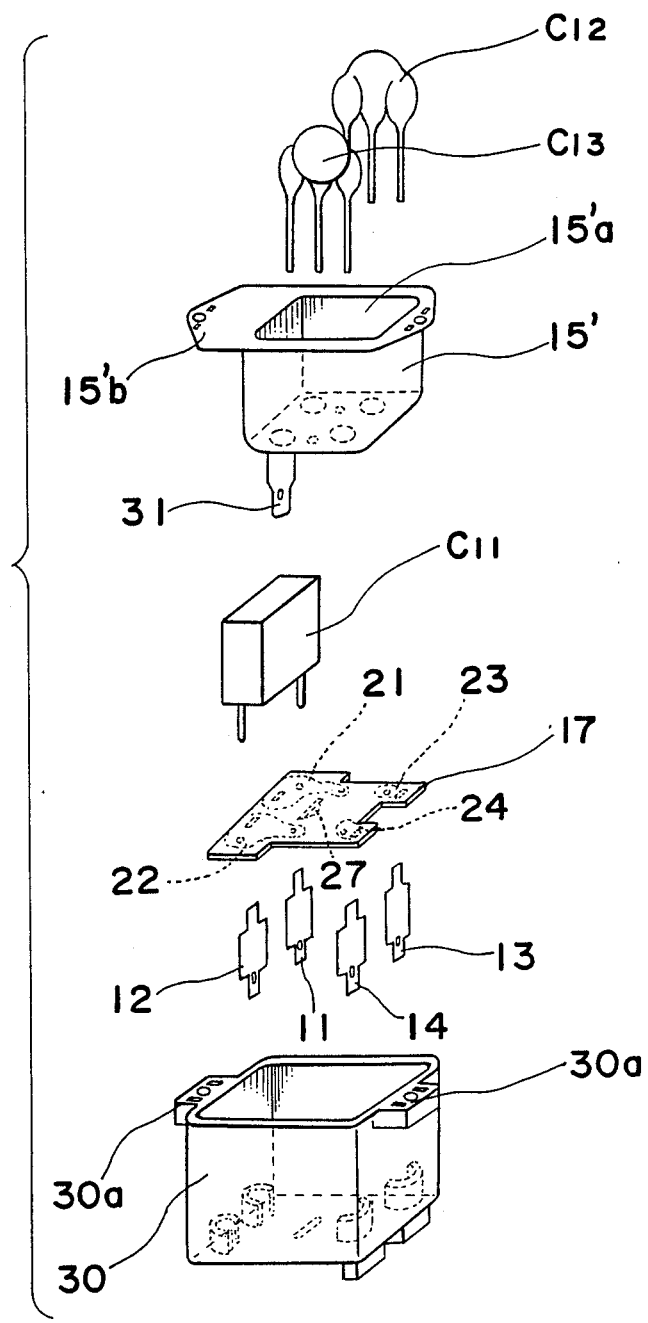
FIG. 15 is an exploded view showing all components of the line filter of FIG. 9.

The three-terminal condenser C12 (C13) can be provided in a modified construction such as shown in FIG. 8. The three-terminal condenser of FIG. 8 comprises a lead frame 44 providing by dieing out a sheet of metal plate into a configuration of substantial U pattern consisting of a middle portion 44c and a pair of leg portions 44a, 44b, a chip condenser 45 of rectangular type having a pair of electrodes 45a, 45b at the both ends, one of the electrodes 45a being soldered onto the middle portion 44c of the lead frame 44, a lead terminal 46 of metal plate having one end being soldered onto the other electrode 45b of the chip condenser 45, and placed in parallel to and between the leg portions 44a, 44b, a pair of bead cores 40a, 40b made from ferrite materials each having a cylindrical shape with an opening through which the leg portion 44a (44b) is inserted to pass, and a covering means 42 of resin for mounting all components 44, 45, 40a, 40b, 46 of the three-terminal condenser therein except for the ends of the three leg portions which are extending from the resin to the outside, the three-terminal condenser C12 (C13) being formed as a whole of a rectangular type with thin thickness.

Though a pair of bead cores are provided in the three-terminal condensers of FIG. 4 and FIG. 8, one of the bead cores 40a, 40b can be deleted from the side of the leg or leg portion which is connected with the output terminals 13, 14, which leaves only the bead core at the other side of leg or leg portion to be connected with the input terminals 11, 12.

Also, although in the line filter of FIG. 2 the electrodes are provided on the front surface of the printed circuit board 17, the electrodes can be provided on the bottom surface of the printed circuit board 17 in a known manner.

FIGS. 9 to 15 show another embodiment of a line filter of the present invention, which is constructed with the same equivalent circuit arrangement as shown in FIG. 7. The line filter of this embodiment comprises a metal case 15' having a room 15'a, an earth terminal 31 and a flange 15'b for mounting, a sheet of printed circuit board 17 provided thereon with a pair of input electrodes 21, 22, a pair of output electrodes 23, 24 and an earth electrode 27, and mounted insulatingly on the bottom surface of the metal case 15', a pair of input terminals 11, 12 connected with the pair of input electrodes 21, 22 by solder, a pair of output terminals 13, 14 connected with the pair of output electrodes 23, 24 by solder, a two-terminal condenser C11 for normal mode noise having two terminals connected with the pair of input electrodes by solder at a position close to the outside surface of the metal case 15', and a pair of three-terminal condensers C12, C13 for common mode noise each having three terminals connected with the input, output and earth electrodes 21, 23, 27 (22, 24, 27) by solder and accommodated insulatingly in the room 15'a of the metal case 15'. A resin case 30 is provided for accommodating therein the sheet of printed circuit board 17, two-terminal condenser C11 and metal case 15', the flange 15'b, of metal case 15' being secured on a pair of tabs 30a, 30a of the resin case 30, all the terminals 11, 12, 13, 14, 31 extending to the outside of the resin case 30. The soldering of all the terminals 11, 12, 13, 14, 31 onto the respective electrodes 21, 22, 23, 24, 27 of the sheet 17 is done at one time by inserting into a bath of solder in a known manner. It is to be noted that the soldering between the electrodes of the printed circuit board and the corresponding terminals are made at the same time of soldering between the earth terminals of condenser C12, C13 and the metal case 15'. Also, the securing of the flange 15'b of metal case 15' onto the tabs 30a, 30a of resin case 30 is made by fitting into with each other in a known manner. The line filter of this embodiment is operated in the same manner as that of the first embodiment with providing the same effect for eliminating noise of the line filter.

Figure 18:
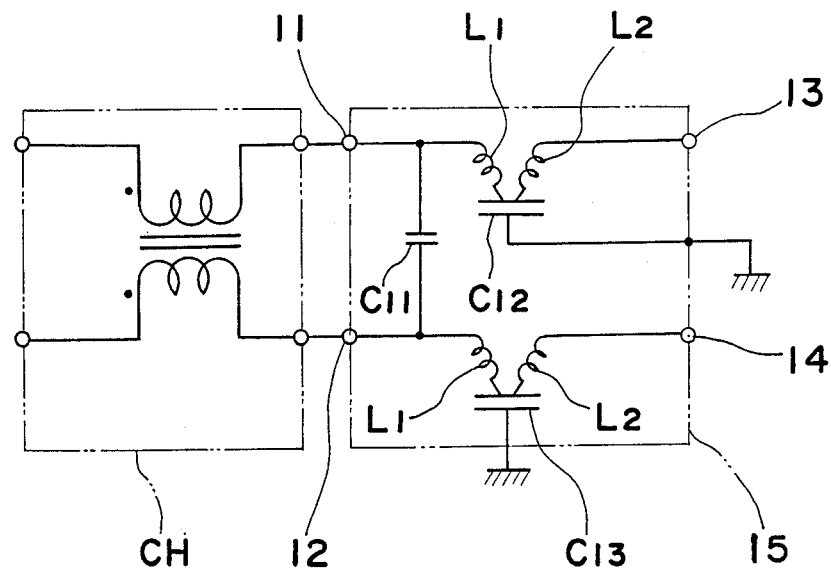
FIG. 18 is an equivalent circuit diagram for the line filter of FIG. 16.
Figure 19:
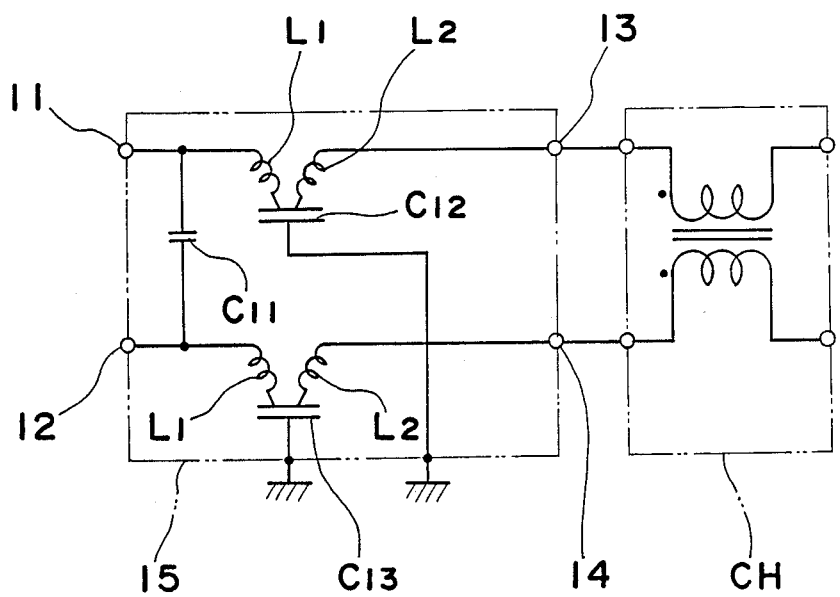
FIG. 19 is a view that is similar to FIG. 18, but showing one modification of the electric arrangement.

Furthermore, in the case of that the noise of high frequency is large in an electric line, it is preferable to provide a choke coil CH at the input side or the output side of the line filter, as shown in FIGS. 16 to 19. In FIG. 18, the input terminals 11, 12 of the line filter are connected with the output terminals of the choke coil CH, while in FIG. 19, the output terminals 13, 14 of the line filter are connected with the input terminals of the choke coil CH. In these cases, it can be freely selected the choke coil CH having a proper constant in response to the noise of frequency to be eliminated.

Figure 16:
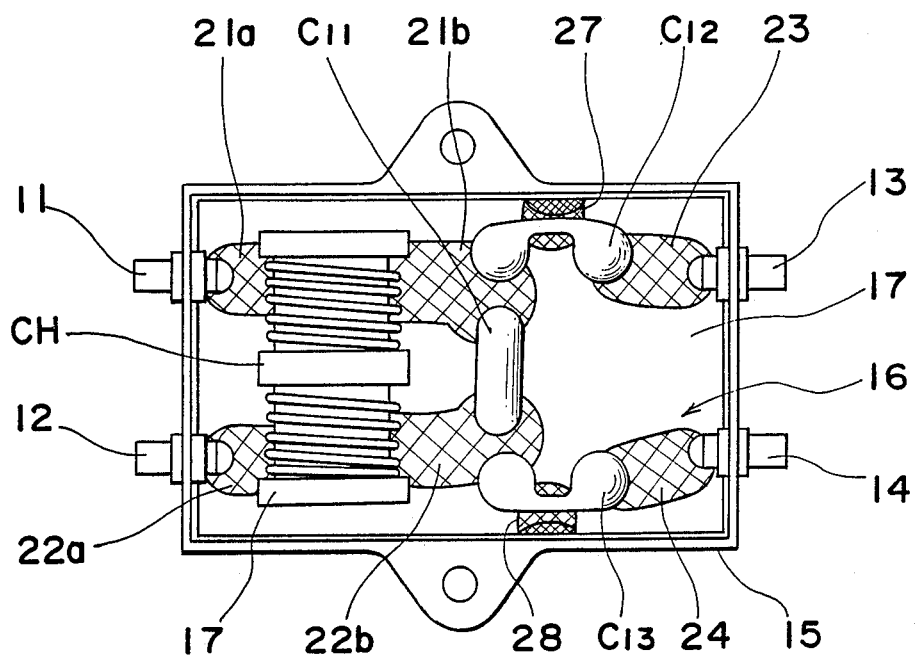
FIG. 16 is a top plan view showing the internal construction of a line filter in accordance with a third embodiment of the present invention.
Figure 17:
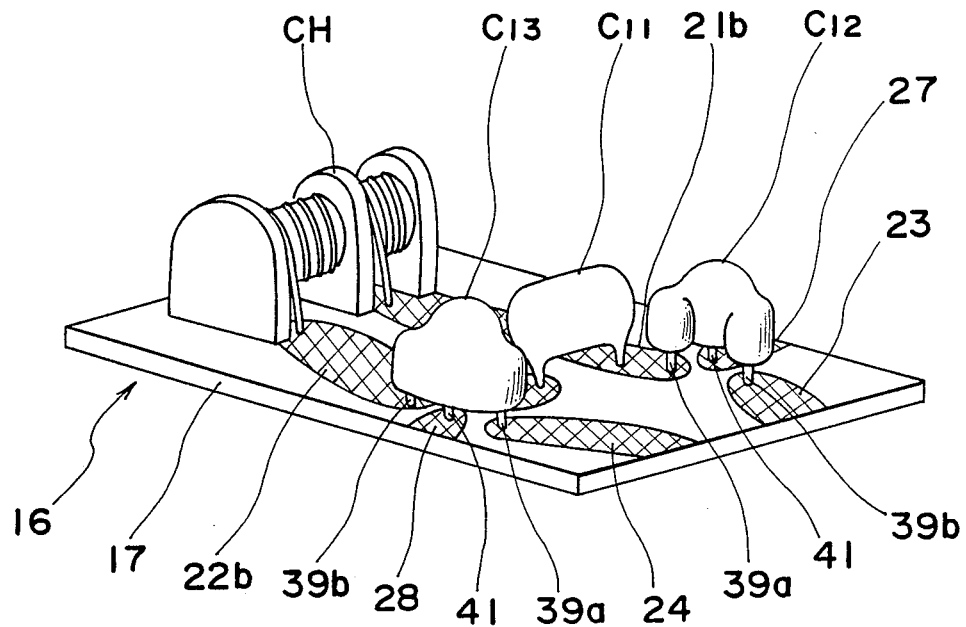
FIG. 17 is a perspective view of a filter unit employed in the line filter of FIG. 16.

In FIG. 16, each of the input electrodes 21, 22 is divided into two portions 21a, 21b (22a, 22b) between which the input and output terminals of the choke coil CH are connected, so that the choke coil CH is mounted integrally on the filter unit 16 as one unit.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A line filter for use in a power source line of an electric device, said filter comprising:
    a container provided insulatingly with a pair of input terminals, a pair of output terminals and an earth terminal;
    a sheet of printed circuit board provided thereon with first and second input electrodes, first and second output electrodes and an earth electrode, and insulatingly accommodated within the container, said first and second input ant output electrodes defining respective first and second signal paths;
    said input electrodes being connected with the input terminals, said output electrodes with the output terminals and said earth electrode with the earth terminal;
    a bypass-type condenser having terminals for suppressing a normal mode noise, each said terminal being connected to a respective one of said first and second signal paths by a lead terminal;
    a pair of bypass-type condensers having three terminals for suppressing a common mode noise having first, second and third lead terminals, each said third lead terminal being connected to said earth electrode and said first and second lead terminals being connected respectively to said input and output electrodes of a respective one of said signal paths; and means for preventing LC resonance at ultra-high frequencies between said two-terminal and three-terminal condensers and said lead terminals of said two-terminal condenser, said meanss comprising a pair of bead cores on the first and second lead terminals of said three-terminal condensers, in series with each of said first and second signal paths.

2. The line filter as defined in claim 1, wherein the container comprises a metal case for accommodating insulatingly therein the sheet of printed circuit board and providing insulatingly thereon the pair of input terminals and the pair of output terminals, the earth terminal being connected with the metal case.

3. The line filter as defined in claim 2, wherein the sheet of printed circuit board is secured on the metal case.

4. The line filter as defined in claim 1, wherein the container comprises a metal case for mounting the sheet of printed circuit board thereon and for accommodating therein all the bypass-type condensers, and a resin case for covering the metal case therein.

5. The line filter as defined in claim 1, wherein the bead cores are formed of cylinders made of ferrite materials and having openings into which the lead terminals are inserted.

6. The line filter as defined in claim 1, further comprising a choke coil connected between said first and second signal paths.

* * * * *